US008587501B2

(12) United States Patent
White et al.

(10) Patent No.: US 8,587,501 B2
(45) Date of Patent: Nov. 19, 2013

(54) ELECTROLUMINESCENT DISPLAY DEVICE WITH OPTICALLY COMMUNICATING CHIPLETS

(75) Inventors: Christopher J. White, Avon, NY (US); Ronald S. Cok, Rochester, NY (US); John W. Hamer, Rochester, NY (US); Andrew Arnold, Hilton, NY (US)

(73) Assignee: Global OLED Technology LLC, Herndon, VA (US)

( * ) Notice: Subject to any disclaimer, the term of this patent is extended or adjusted under 35 U.S.C. 154(b) by 349 days.

(21) Appl. No.: 13/029,549

(22) Filed: Feb. 17, 2011

(65) Prior Publication Data
US 2012/0212465 A1    Aug. 23, 2012

(51) Int. Cl.
*G09G 3/30*    (2006.01)
*H01L 33/00*    (2010.01)

(52) U.S. Cl.
USPC ............ 345/81; 345/206; 345/207; 257/98

(58) Field of Classification Search
None
See application file for complete search history.

(56) References Cited

U.S. PATENT DOCUMENTS

| | | | |
|---|---|---|---|
| 4,769,292 A | 9/1988 | Tang et al. | |
| 4,995,057 A | 2/1991 | Chung | |
| 5,061,569 A | 10/1991 | VanSlyke et al. | |
| 5,200,631 A | 4/1993 | Austin et al. | |
| 5,231,485 A | 7/1993 | Israelsen et al. | |
| 5,726,786 A | 3/1998 | Heflinger | |
| 5,787,117 A | 7/1998 | Ash | |
| 5,903,016 A * | 5/1999 | Whitney | 257/84 |
| 6,031,251 A * | 2/2000 | Gempe et al. | 257/84 |
| 6,088,369 A | 7/2000 | Dabecki et al. | |
| 6,141,465 A | 10/2000 | Bischel et al. | |
| 6,259,838 B1 | 7/2001 | Singh et al. | |
| 6,526,080 B1 * | 2/2003 | Shin | 372/45.01 |
| 6,661,940 B2 | 12/2003 | Kim | |
| 6,879,098 B2 | 4/2005 | Buchwalter et al. | |
| 7,095,620 B2 | 8/2006 | Bozso et al. | |
| 7,120,327 B2 | 10/2006 | Bozso et al. | |
| 7,546,004 B2 | 6/2009 | Beausoleil et al. | |
| 7,551,453 B2 | 6/2009 | Bozso et al. | |
| 7,557,367 B2 | 7/2009 | Rogers et al. | |
| 7,622,367 B1 | 11/2009 | Nuzzo et al. | |

(Continued)

FOREIGN PATENT DOCUMENTS

WO    WO 2010/046643 A2    4/2010

OTHER PUBLICATIONS

PCT Written Opinion and International Search Report dated Sep. 28, 2011.

*Primary Examiner* — James Wozniak
*Assistant Examiner* — Antonio Xavier
(74) *Attorney, Agent, or Firm* — Global OLED Technology LLC (57) ABSTRACT

An electroluminescent display includes a display substrate, a plurality of patterned first electrodes formed over the display substrate, one or more layers of light-emitting material formed over the plurality of first electrodes, at least one second electrode formed over the one or more layers of light-emitting material, and a plurality of chiplets. Each chiplet is electrically connected to a first electrode. Each chiplet further includes a light detector and a light emitter separate from the one-or-more layers of light-emitting material connected to the chiplet circuitry. The chiplet circuitry includes a modulating circuit for modulating light emitted by the light emitter and a demodulating circuit for demodulating light detected by the light detector so that light emitted by the light emitter of a first chiplet is received by the light detector of a second chiplet.

17 Claims, 5 Drawing Sheets

(56) References Cited

U.S. PATENT DOCUMENTS

| | | |
|---|---|---|
| 7,769,114 B2 | 8/2010 | Taya |
| 8,081,177 B2* | 12/2011 | White et al. .................. 345/207 |
| 2002/0178319 A1 | 11/2002 | Sanchez-Olea |
| 2003/0042494 A1* | 3/2003 | Worley .......................... 257/98 |
| 2003/0223756 A1* | 12/2003 | Tatum et al. .................. 398/135 |
| 2004/0140763 A1* | 7/2004 | Buchwalter et al. .......... 313/506 |
| 2005/0213983 A1* | 9/2005 | Shie et al. ..................... 398/135 |
| 2006/0055864 A1 | 3/2006 | Matsumura et al. |
| 2007/0032089 A1 | 2/2007 | Nuzzo et al. |
| 2007/0057263 A1 | 3/2007 | Kahen |
| 2007/0172176 A1* | 7/2007 | Yap et al. ........................ 385/88 |
| 2008/0008472 A1 | 1/2008 | Dress et al. |
| 2008/0054275 A1* | 3/2008 | Vogel et al. ..................... 257/84 |
| 2008/0054276 A1* | 3/2008 | Vogel et al. ..................... 257/84 |
| 2008/0088568 A1* | 4/2008 | Haga et al. ..................... 345/100 |
| 2008/0131047 A1* | 6/2008 | Beausoleil et al. .............. 385/1 |
| 2009/0199960 A1 | 8/2009 | Nuzzo et al. |
| 2009/0289265 A1 | 11/2009 | Roozeboom et al. |
| 2010/0001639 A1 | 1/2010 | Kim et al. |
| 2010/0039030 A1* | 2/2010 | Winters et al. ................. 313/505 |
| 2010/0123268 A1 | 5/2010 | Menard |
| 2010/0201253 A1* | 8/2010 | Cok et al. ....................... 313/498 |
| 2010/0207848 A1* | 8/2010 | Cok ................................. 345/76 |
| 2010/0207849 A1* | 8/2010 | Cok et al. ........................ 345/76 |
| 2010/0309100 A1* | 12/2010 | Cok et al. ........................ 345/76 |
| 2010/0315319 A1* | 12/2010 | Cok et al. ........................ 345/77 |
| 2010/0328196 A1* | 12/2010 | Cok ................................. 345/76 |
| 2011/0122091 A1* | 5/2011 | King et al. ...................... 345/175 |
| 2011/0147776 A1* | 6/2011 | Hikosaka et al. ................ 257/98 |

* cited by examiner

ELECTROLUMINESCENT DISPLAY DEVICE WITH OPTICALLY COMMUNICATING CHIPLETS

CROSS REFERENCE TO RELATED APPLICATION

Reference is made to commonly-assigned co-pending U.S. patent application Ser. No. 12/549,416, filed Sep. 28, 2009, entitled "CHIPLET DISPLAY WITH OPTICAL CONTROL", the disclosures of which are incorporated by reference herein.

FIELD OF THE INVENTION

The present invention relates to display devices having a substrate with distributed, independent chiplet control elements.

BACKGROUND OF THE INVENTION

Flat-panel display devices are widely used in conjunction with computing devices, in portable devices, and for entertainment devices such as televisions. Such displays typically employ a plurality of pixels distributed over a substrate to display images. Each pixel incorporates several, differently colored light-emitting elements commonly referred to as sub-pixels, typically emitting red, green, and blue light, to represent each image element. Pixels and sub-pixels are not distinguished herein; all light-emitting elements are called pixels. A variety of flat-panel display technologies are known, for example plasma displays, liquid crystal displays, and light-emitting diode displays. Active-matrix elements are not necessarily limited to displays and can be distributed over a substrate and employed in other applications requiring spatially distributed control.

Area light-emitting diodes (LEDs) incorporating thin films of light-emitting materials forming light-emitting elements have many advantages in a flat-panel display device and are useful in optical systems. Organic LED color displays that include an array of organic LED light-emitting elements are known. Alternatively, inorganic materials can be employed and can include phosphorescent crystals or quantum dots in a polycrystalline semiconductor matrix. Other thin films of organic or inorganic materials can also be employed to control charge injection, transport, or blocking to the light-emitting-thin-film materials, and are known in the art. The materials are placed upon a substrate between electrodes, with an encapsulating cover layer or plate. Light is emitted from a pixel when current passes through the light-emitting material. The frequency of the emitted light is dependent on the nature of the material used. In such a display, light can be emitted through the substrate (a bottom emitter) or through the encapsulating cover (a top emitter), or both.

LED devices can include a patterned light-emissive layer wherein different materials are employed in the pattern to emit different colors of light when current passes through the materials. Alternatively, one can employ a single emissive layer, for example, a white-light emitter, together with color filters for forming a full-color display. It is also known to employ a white sub-pixel that does not include a color filter, or to employ an un-patterned white emitter with a four-color pixel comprising red, green, and blue color filters and sub-pixels and an unfiltered white sub-pixel to improve the efficiency of the device.

Two different methods for controlling the pixels in a flat-panel display device are generally known: active-matrix control and passive-matrix control. In an active-matrix device, control elements are distributed over the flat-panel substrate. Typically, each sub-pixel is controlled by one control element and each control element includes at least one transistor. For example, in a simple active-matrix organic light-emitting (OLED) display, each control element includes two transistors (a select transistor and a power transistor) and one capacitor for storing a charge specifying the brightness of the sub-pixel. Each light-emitting element typically employs an independent control electrode and a common electrode.

Prior-art active-matrix control elements typically include thin-film semiconductor materials, such as silicon, formed into transistors and capacitors through photolithographic processes. The thin-film silicon can be either amorphous or polycrystalline. Thin-film transistors made from amorphous or polycrystalline silicon are relatively larger and have lower performance than conventional transistors made from crystalline silicon wafers. Moreover, such thin-film devices typically exhibit local or large-area non-uniformity that results in perceptible non-uniformity in a display employing such materials, and the manufacturing processes are expensive.

Matsumura et al discuss crystalline silicon substrates used with LCD displays in US 2006/0055864. Matsumura describes a method for selectively transferring and affixing pixel-control devices made from first semiconductor substrates onto a second planar display substrate. Wiring interconnections within the pixel-control device and connections from busses and control electrodes to the pixel-control device are shown.

Regardless of the control methodology for a flat-panel display device, active-matrix display devices incorporate control elements within the flat panel for controlling the individual pixels. These control elements receive data from a display controller external to the display. The data is communicated via electrical signals transmitted through wires formed on the flat-panel display substrate. Such control signals are limited in bandwidth because of the length of the wires, the wire conductivity, and the arrangement of the wires. For large displays of high resolution, such communication bandwidth restrictions can limit the refresh rate of the display, the resolution, or the accuracy and precision of the display signals.

Optical communication on a circuit board is described in U.S. Pat. Nos. 7,095,620 and 7,120,327. A photonic interconnection system is described in U.S. Pat. No. 7,546,004. A computer system with optical buss architecture is described in US 2002/0178319. However, these disclosures do not provide improved communication between pixel control elements in a flat-panel display.

U.S. Pat. No. 5,200,631 describes communication between chips on stacked substrates, e.g., circuit boards plugged into a backplane. US 2009/0289265 describes a similar scheme, only for vertically-stacked dice in a multi-chip system-in-package. These schemes are not applicable to display devices, in which the substrate viewed by the user cannot be obscured by a stacked substrate or other component.

US 2010/0001639 describes an optical touchscreen using an OLED. Light emitted by the OLED reflects off an object pressed against the screen and is detected by an on-panel photosensor. This scheme does not provide communication between active-matrix control elements, and depends on objects external to the display to reflect light.

WO2010046643 describes chiplets including light sensors for detecting the position of the chiplet and OLED with respect to each other. It does not address the need to improve communication between active-matrix control elements.

There is a need, therefore, for an improved method of communicating signals to and between active-matrix elements in a flat-panel display.

SUMMARY OF THE INVENTION

According to the present invention, there is provided an electroluminescent display, comprising:

(a) a display substrate having a device side and a display area;

(b) a plurality of patterned first electrodes formed over the display substrate device side in the display area, one or more layers of light-emitting material formed over the plurality of first electrodes, and at least one second electrode formed over the one or more layers of light-emitting material, the first and second electrodes providing current to cause the light-emitting material to emit light in a light-emitting area within the display area;

(c) a plurality of chiplets, each chiplet having: a chiplet substrate separate and independent from the display substrate located over, and adhered to, the device substrate device side in the display area; one or more connection pads; and a chiplet circuit formed in the chiplet, the chiplet circuit electrically connected to one or more connection pads and at least one connection pad electrically connected to a first electrode; and (d) wherein each chiplet further includes a light detector and a light emitter separate from the one-or-more layers of light-emitting material connected to the chiplet circuitry and the chiplet circuitry includes a modulating circuit for modulating light emitted by the light emitter and a demodulating circuit for demodulating light detected by the light detector.

The present invention has the advantage that it improves the communication between a plurality of control elements in a flat-panel substrate. Optical distribution removes delays experienced by electrical communications methods, including transmission-line and RLC delays. The present invention therefore provides communications with increased bandwidth and reduced latency. Wavelength-division multiplexing can be used to further increase bandwidth. Transmitting light through the display backplane or a waveguide does not objectionably increase the volume occupied by the display. Forming light detectors and emitters on the chiplets permits the use of high-density lithography to form effective optical circuits on the chiplets. The present invention does not increase manufacturing cost of the substrate as do prior art methods of substrate light-piping. The present invention provides robust communications between chiplets, which communication can be interrupted only by breaking the substrate.

BRIEF DESCRIPTION OF THE DRAWINGS

Because the range of layer thicknesses in the drawings is too great, the drawings are not to scale.

DETAILED DESCRIPTION OF THE INVENTION

Figure 1:
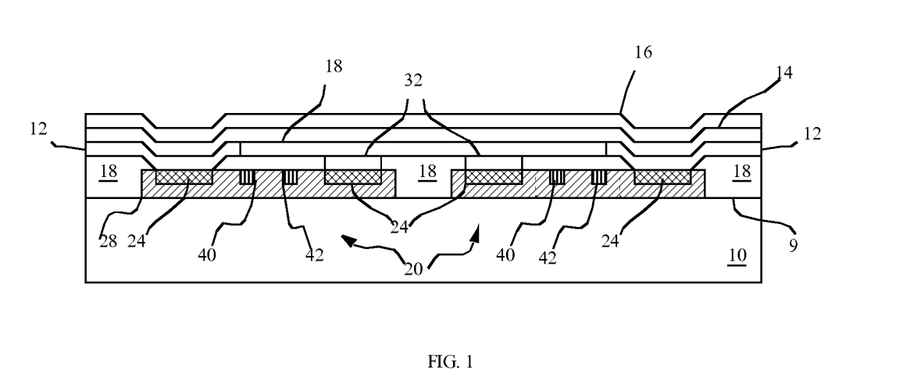
FIG. 1 is a partial cross section of a display device having chiplets according to an embodiment of the present invention.
Figure 2:
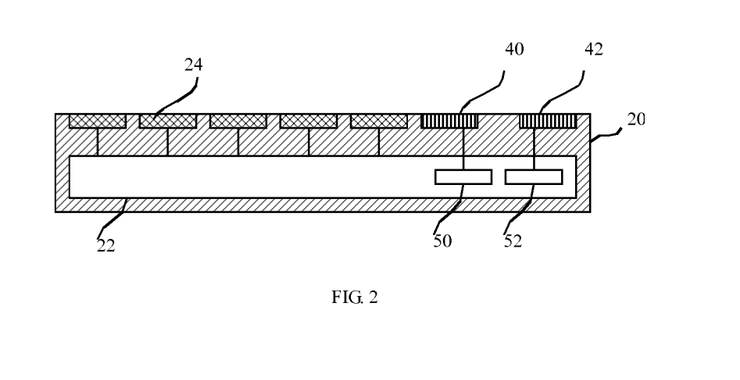
FIG. 2 is a partial cross section of a chiplet according to an embodiment of the present invention.
Figure 4:
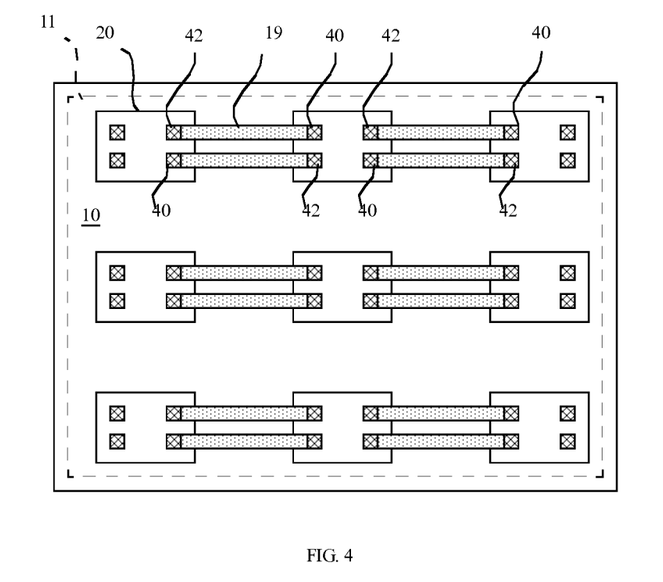
FIG. 4 is a top view of a display device illustrating waveguides according to an embodiment of the present invention.

Referring to FIGS. 1 and 2, an electroluminescent display has a display substrate 10 having a device side 9 and a display area 11 (shown in FIG. 4). A plurality of patterned first electrodes 12 are formed over the display substrate 10 device side 9 in the display area, one or more layers 14 of light-emitting material are formed over the plurality of first electrodes 12, and at least one second electrode 16 is formed over the one or more layers 14 of light-emitting material, the first and second electrodes 12, 16 providing current to cause the layer 14 of light-emitting material to emit light in a light-emitting area within the display area. A plurality of chiplets 20 are adhered to the substrate 10, each chiplet 20 having: a chiplet substrate 28 separate and independent from the display substrate 10 located over, and adhered to, the device substrate 10 device side 9 in the display area; one or more connection pads 24; and a chiplet circuit 22 formed in the chiplet 20, the chiplet circuit 22 electrically connected to one or more connection pads 24 and at least one connection pad 24 electrically connected to a first electrode 12. Each chiplet 20 further includes a light detector 42 and a light emitter 40 separate from the one-or-more layers 14 of light-emitting material connected to the chiplet circuitry 22. The chiplet circuitry 22 includes a modulating circuit 50 for modulating light emitted by the light emitter 40 and a demodulating circuit 52 for demodulating light detected by the light detector 42.

The light emitted by light emitter 40 can be modulated by various methods, including on-off keying (OOK), amplitude modulation (AM), phase modulation (PM), or frequency modulation (FM). The data to be transmitted between chiplets 20 using this light can be digital or analog in form. The data can be compressed on transmission and decompressed on reception, e.g., using LZW or Huffman coding. The data can be coded various ways, e.g., by 4B5B, 8B10B, Manchester coding or another self-clocking coding, block coding, convolutional coding, or trellis coding. CRCs or checksums can be added by modulating circuit 50 and verified by demodulating circuit 52 to maintain data integrity. Messages received with errors can be discarded, or retransmission can be requested. Modulating circuit 50 and demodulating circuit 52 can include appropriate digital or analog circuitry, including digital-to-analog (DAC) or analog-to-digital (ADC) converters, to implement these modulation and coding methods. Modulating and demodulating circuits useful in various embodiments are described in U.S. Pat. No. 5,787,117 and U.S. Pat. No. 7,769,114(including AM, FM, PM, and OOK), U.S. Pat. No. 5,231,485(including Huffman coding), U.S. Pat. No. 6,088,369(including 4B5B and 8B10B), and U.S. Pat. No. 4,995,057(including block and convolutional coding), the disclosures of all of which are incorporated herein by reference.

In an embodiment, the data to be transmitted are digital. Modulating circuit 50 adds an even-parity bit to each 8-bit byte of data, yielding a 9-bit message having an even number of 1 bits. Modulating circuit 50 includes a data clock and an XOR circuit that takes the exclusive-OR of each data bit in turn with the data clock, where each data bit is presented to the XOR circuit in a consecutive cycle of the data clock (where a cycle starts on the rising edge of the clock). This results in a Manchester-coded output in which a 1 bit of data is represented by a 0-to-1 transition in the middle of a data clock cycle, and a 0 bit is represented by a 1-to-0 transition. Light emitter 40 emits light when the output of the XOR circuit is a 1, and does not emit when the output is a 0. Demodulating circuit 52 receives a Manchester pulse train (plus noise) from light detector 42. Demodulating circuit 52 includes a phase-locked loop that identifies the transitions in the middle of the data clock cycles and regenerates the data clock. Demodulating circuit 52 stores the value of the pulse train immediately after each mid-cycle transition, e.g., by providing the pulse train on the D input of a serial-in parallel-out shift register clocked on the rising edge of the regenerated data clock. Once all nine bits of a message have been received, demodulating circuit 52 counts the number of 1 bits to make sure that it is even. If it is, the eight-bit byte of data is provided to other elements of chiplet circuit 22 in the receiving chiplet for processing.

The chiplets 20 are adhered to the substrate 10 and have a transparent insulating layer 18 covering a portion of the chiplet 20, exposing the connection pads 24 to permit the connection pads 24 to be connected to the first electrodes 12 or other interconnection conductors 32. The chiplet circuit 22 includes circuitry for controlling current flow between the first and second electrodes 12, 16 and for controlling the light emitter 40 and light detector 42. Insulating layer 18 can be a planarization layer, or can include a planarization layer. Insulating layer 18, or its components, can reflect or transmit light.

In this invention, it is important that the least amount of light emitted by emitter 40 be absorbed or scattered by the medium before being received by detector 42. Thus, as used herein, "transparent" means at least 50% of the light is transmitted through the medium between the emitter and detector, preferably at least 80% or most preferably, at least 90% light transmittance.

The insulating layer 18 can be transparent so as to transmit light emitted by the one or more layers 14 of light-emitting material or light emitted by the light emitters 40. The transparent insulating layer 18 can extend over or around at least a portion of the chiplets 20 and the light emitter 40 of the chiplet 20 can emit light into insulating layer 18, which can be transparent. The conductors 32 can electrically interconnect the chiplets to each other or can electrically interconnect the chiplets 20 to an external controller.

According to the present invention, chiplets 20 in the display area communicate by sending messages to other chiplets 20 using light emitted by the light emitters 40 and by receiving messages from other chiplets 20 using light received from the light detectors 42. The messages can include image information and pixel data that are used to drive the first electrodes 12 or second electrodes 16 (pixel electrodes) through connection pads 24. The brightness of the light can be temporally modulated to carry signals, for example digital signals that are optically transmitted from one chiplet to another chiplet. The light signals can be at least partly in the visible or infrared range or can have the same frequency as or a different frequency than the frequency of the light emitted by the one or more light-emitting layers. The chiplets can include memory to store image information.

In one embodiment of the present invention, a controller distributes image information to the chiplets 20. The controller is external to the display substrate and can include a controller optical light emitter that emits light into the display substrate or waveguide structure. The image information can be at the same resolution as the display or can be at a higher or lower resolution than the display. Each chiplet 20 can display the image information associated with the pixels controlled by the chiplet 20. Chiplets 20 can also optically communicate image information to other chiplets 20 for display by the other chiplets 20, for example to enable panning an image on the display, zooming in on an image on the display (by interpolating pixels) or zooming out of an image on the display (by sampling pixels). Because images can be very large, the high bandwidth and low noise available with optical communication provides an effective way of transferring image data from one chiplet 20 to another chiplet 20 and enables effective image manipulation and operation on a display.

Figure 3A:
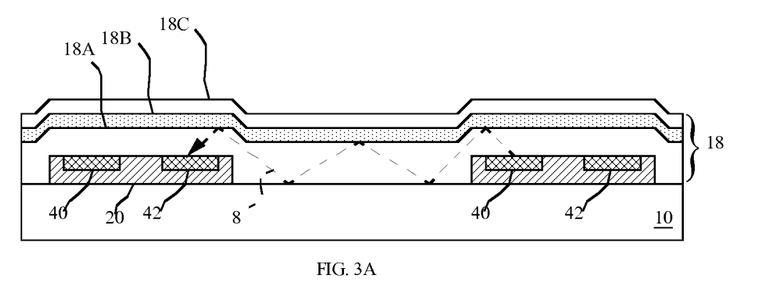
FIGS. 3A, 3B, 3C, and 3D are partial cross sections of a display device illustrating light rays traveling through the display device according to various embodiments of the present invention.

Referring to FIGS. 3A-3D according to various embodiments of the present invention, the optical intercommunication can be enabled in a variety of ways. As illustrated in FIG. 3A, light rays can be emitted from a light emitter 40 in one chiplet 20 and received by the light detectors 42 in another chiplet 20. As shown in FIG. 3A, the light signal 8 can propagate in insulating layer 18, which can be wholly- or partially-transparent. In the embodiment illustrated in FIG. 3A, layer 18 includes transparent layer 18A of insulating planarization material formed over the chiplets 20 and, particularly, over the light emitters 40 and light detectors 42 of each chiplet 20. Reflective layer 18B, formed over transparent layer 18A, reflects the emitted light and also protects the light detectors 42 from ambient light or light emitted by the one or more light-emitting layers 14, thus reducing noise in the optical communication signal. Reflective layer 18B can be formed, for example, from evaporated metal, such as aluminum or silver, and can be continuous or patterned. An protective layer 18C, which can be or include an insulating layer or a planarizing layer, can then be located over reflective layer 18B to avoid chemical or electrical interactions with the material used to make reflective layer 18B.

Figure 3B:
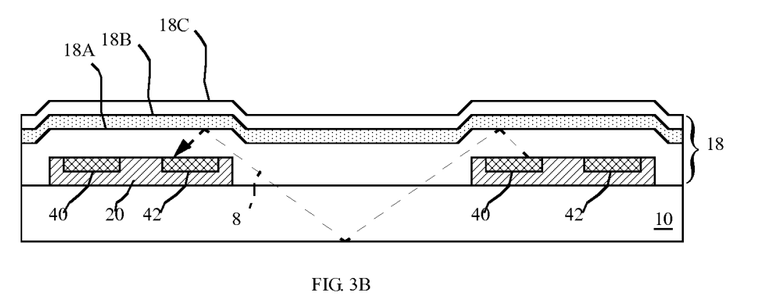

In an alternative embodiment of the present invention shown in FIG. 3B, the light signal 8 emitted by light emitters 40 in one chiplet 20 and received by a light detector 42 in another chiplet 20 can also propagate through the substrate 10, if the substrate 10 is transparent to the emitted light signal 8. As shown in FIG. 3B, the emitted light travels through the transparent layer 18A and the substrate 10, and is reflected by reflective layer 18B. The protective layer 18C can protect other display elements from reflective layer 18B. Hence, the display substrate 10 can transmit or reflect the light signal 8.

Figure 3C:
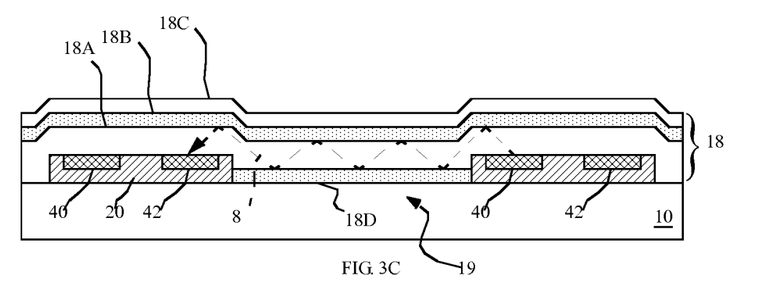

In a third embodiment of the present invention shown in FIG. 3C, the light signal emitted by light emitters 40 in one chiplet 20 and received by a light detector 42 in another chiplet 20 propagates through the transparent layer 18A and is reflected by reflective layer 18B and an opposing second reflective layer 18D formed over the substrate 10. In this embodiment, the light signal 8 is protected by reflective layers 18B and 18D on either side of a light channel formed by transparent layer 18A, thus reducing the optical interference both from the light-emission and ambient light on the top side of the device and from ambient light from the bottom, substrate side of the device. In this embodiment, the reflective layers 18D and 18B, together with the transparent layer 18A effectively form an optical waveguide structure that extends from one chiplet 20 to another chiplet 20 and transmits light signal 8 emitted by the light emitter 40 into the waveguide structure. The waveguide structure can form a point-to-point light pipe that guides light from one specific chiplet light emitter 40 to another specific chiplet light detector 42. Alternatively, the waveguide structure can effectively transmit emitted light from one or more light emitters 40 to one or more light detectors 42 or can transmit emitted light both to and from a single chiplet 20 by including both light emitters 40 and light detectors 42.

Figure 3D:
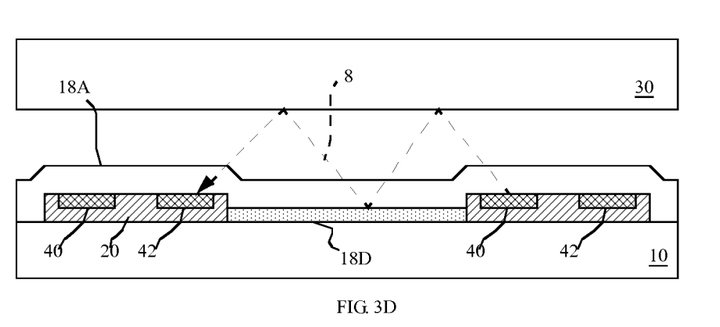

In yet another alternative embodiment of the present invention shown in FIG. 3D, the light signal 8 emitted by light emitters 40 in one chiplet 20 and received by a light detector 42 in another chiplet 20 can also propagate through a gap between transparent layer 18A and a cover 30. As shown in FIG. 3D, the emitted light travels through the transparent layer 18A and the gap. A reflective layer 18D formed over the substrate 10 can reflect the light signal 8. The light signal 8 can also travel through the cover 30 (not shown). Hence, the cover 30 can transmit or reflect the light signal 8.

FIG. 4 is a top view of a display having a substrate 10 with chiplets 20 having light emitters 40 and light detectors 42. Light pipes 19 can guide light from one specific chiplet light emitter 40 to another specific chiplet light detector 42. Such point-to-point waveguide structures increase the available communication bandwidth, since multiple light signals can be sent simultaneously through separate light pipes 19 to and from separate chiplets 20. As shown in FIG. 4, each chiplet 20 can communicate with a neighboring chiplet 20 through two light pipes 19, one light pipe 19 dedicated to transmitting to one chiplet and the other dedicated to receiving from the same chiplet. Alternatively, a single light pipe can be used for both transmission and reception of light signals for a single chiplet.

Figure 5:
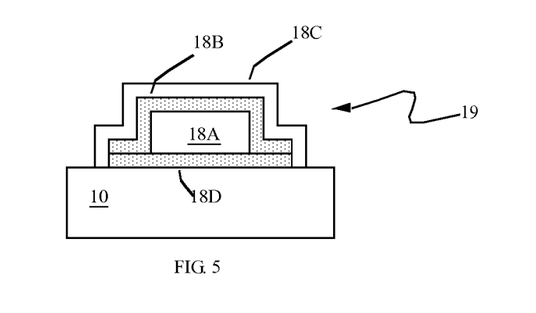
FIG. 5 is a cross section of a wave guide within a display device according to an embodiment of the present invention.

FIG. 5 is a cross section of a light pipe 19 that shows a reflective layer 18D formed on a substrate 10, a transparent layer 18A, and a second reflective layer 18B over and surrounding the transparent layer 18A. An optional protective layer 18C is used to protect the light pipe materials and structure.

Figure 6:
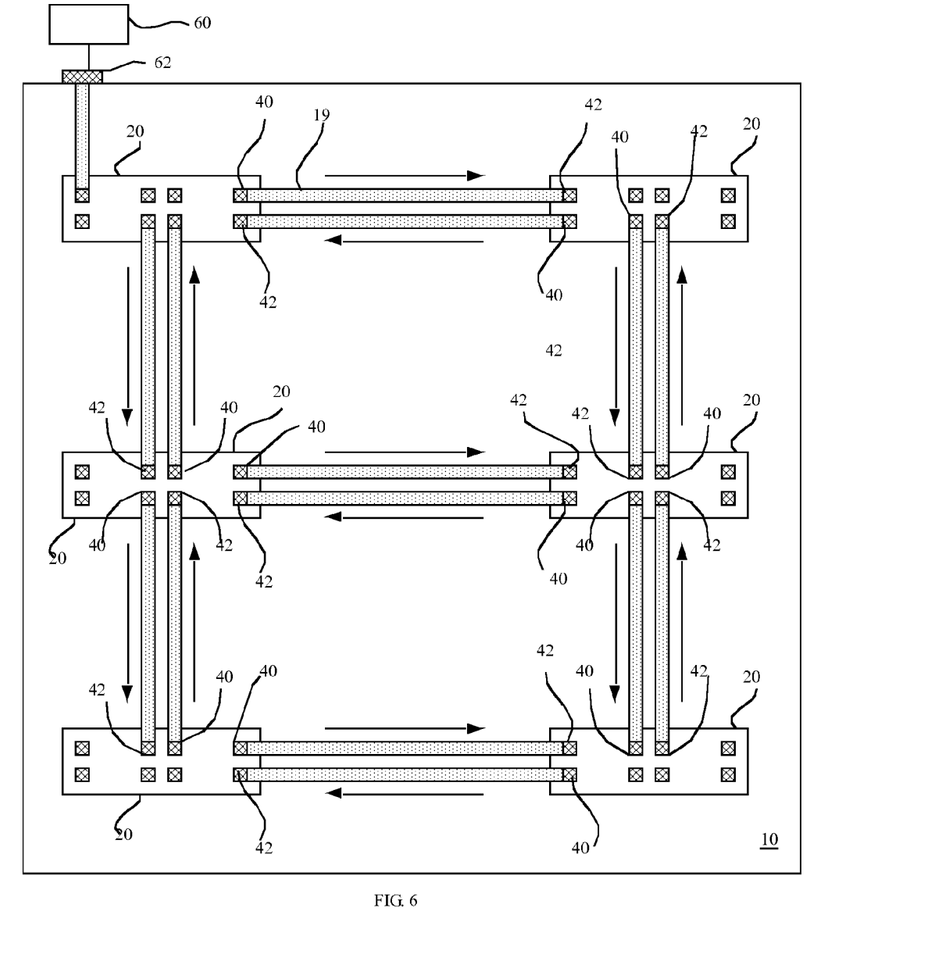
FIG. 6 is a top view of a display device illustrating waveguides according to an embodiment of the present invention.

FIG. 6 is a top view of a display device according to an embodiment of the present invention illustrating the communication paths available from a controller 60, through an optical transceiver 62 to a light pipe 19. Each of the chiplets 20 located in a two-dimensional array communicates through single-direction light pipes 19 with its neighbors in each dimension of the array by emitting light signals from its light emitter 40 into a light pipe 19 to a neighboring chiplet 20 and receiving light signals from the neighboring chiplet 20 through a light pipe 19 by a light detector 42.

The device of the present invention, in one embodiment of the present invention, is operated by first providing an electroluminescent display as described above together with a display controller that is external to the electroluminescent display. Information, for example image information, is communicated from the display controller to at least a first chiplet in the electroluminescent display. A first chiplet in the electroluminescent display can optically communicate information to a second chiplet in the electroluminescent display by modulating light emitted from the first chiplet light emitter and detecting the modulated light by the second chiplet light detector. Each chiplet can then drive the first electrodes to which it is connected in accordance with the information to cause at least a portion of the light-emitting layer to emit light.

In one embodiment of the present invention, modulated light emitted by the first chiplet light emitter is detected by multiple, and more preferably all of the chiplets and their light detectors. In such an embodiment, the communication is broadcast. In another embodiment, modulated light emitted by the first chiplet light emitter is transmitted to only the second chiplet and detected by its light detector. In such an embodiment, the communication is point-to-point. The light signal can be temporally modulated.

A substrate or cover can be provided and light emitted by the first chiplet light emitter can be transmitted through, or reflected from, the display substrate or cover.

Waveguides can be formed over the substrate for propagating light signals by providing at least one transparent layer extending over or around at least a portion of the chiplets and light emitted by the first chiplet light emitter can be transmitted into the transparent layer.

A controller external to the display substrate can be provided that emits modulated light into the display substrate to communicate information to one or more chiplets. The transmitted information can be image information and the first chiplet can communicate the image information to another chiplet.

The light-emitting pixels of the present invention are area emitters, employing layers of material coated over a substrate and driven by electrodes coated over and under the layers of material. The light-emitting material layers are not crystalline or formed in silicon. In contrast, the light emitters 40 can be conventional inorganic diodes formed in a crystalline material, such as silicon, that emit light from a small, point source. In particular, the light emitters 40 are separate from the one or more layers 14 of light emitting material, for example as illustrated in FIG. 1. The light emitters 40 are formed in the chiplets 20 and are not coated over the substrate between first electrodes 12 and second electrodes 16 as is the one or more light-emitting layers 14.

According to one active-matrix embodiment of the present invention having chiplets 20, each pixel has an independently controlled first electrode 12 (a control electrode), the second electrode 16 is common to multiple pixels, and the chiplet circuit 22 can provide active-matrix control to the pixels. As also shown in FIG. 2, the chiplet circuit 22 drives more than one pixel through multiple connection pads 24. The connection pad 24 on the chiplet 20 can connect directly to a first electrode 12 (as shown in FIG. 1) or through an electrical conductor 32. In an alternative embodiment of the present invention, one or more chiplet circuits 22 provide passive-matrix control to a plurality of groups of pixels. Such passive-matrix-controlled pixel groups are formed by the overlap of independent orthogonal column and row electrodes that can correspond to first electrodes 12 and second electrodes 16. Chiplet circuits 22, for example in chiplets 20, provide drive currents to activate the first electrodes 12 and second electrodes 16 (column and row electrodes) to drive current through the pixels. Connection pads 24 can connect the chiplets 20 to the first electrodes 12 and the second electrodes 16.

In one embodiment of the present invention, the light emitter is formed in a chiplet having a silicon substrate with doped or undoped areas. Therefore, the light emitter is constructed as an inorganic light emitting diode that provides an inorganic point-source light emitter, for example a conventional light-emitting diode formed in crystalline semiconductor material, such as silicon. The light emitter can be a light-emitting NPN bipolar transistor. The NPN bipolar transistor can include an emitter-base junction and the circuit can include a structure that provides a non-destructive reverse breakdown voltage across the emitter-base junction to cause the transistor to emit light. Because the transistor is formed on and in the surface of the chiplet, light emitted by the transistor can visibly escape from the chiplet. The light emitted by the light emitters is detected with a photo-sensor, for example a photosensitive diode or photosensitive transistor together with circuits known in the art for accumulating charge or sensing current.

Chiplets can have a single row or multiple rows of connection pads along a relatively long side of the chiplet longer than a relatively shorter neighboring side. Chiplets can be connected to an external controller through a buss or through multiple busses. The busses can be serial, parallel, or point-to-point busses and can be digital or analog, optical or electrical. A buss is connected to the chiplets to provide signals, such as power, ground, clock, data, or select signals. More than one buss can be separately connected to one or more controllers or chiplets. Additional busses can supply a variety of signals, including timing (e.g. clock) signals, data signals, select signals, power connections, or ground connections. The signals can be analog or digital, for example digital addresses or data values. Analog data values can be supplied as charge or voltage. The storage registers can be digital (for example including flip-flops) or analog (for example including capacitors for storing charge).

In one embodiment of the present invention, the display device is an OLED display. The controller can be implemented as a chiplet and affixed to the substrate. The controller can be located on the periphery of the substrate, or can be external to the substrate and include a conventional integrated circuit.

According to various embodiments of the present invention, the chiplets can be constructed in a variety of ways, for example with one or two rows of connection pads along a long dimension of a chiplet. Interconnection busses, wires, and reflective layers can be formed from various materials and use various methods for deposition on the device substrate, for example metal, either evaporated or sputtered, for example aluminum or aluminum alloys, magnesium, or silver. Alternatively, the interconnection busses and wires can be made of cured conductive inks or metal oxides. In one cost-advantaged embodiment, the interconnection busses and wires are formed in a single layer. Photosensitive resins or polymers can be used to form the transparent layer 18A or protective layer 18C. Methods for patterning such materials and forming the structures described are known in the photolithographic art.

The present invention is particularly useful for multi-pixel device embodiments employing a large device substrate, e.g. glass, plastic, or foil, with a plurality of chiplets arranged in a regular arrangement over the device substrate. Each chiplet can control a plurality of pixels formed over the device substrate according to the circuitry in the chiplet and in response to control signals. Individual pixel groups or multiple pixel groups can be located on tiled elements, which can be assembled to form the entire display.

According to the present invention, chiplets provide distributed pixel control elements over a substrate. A chiplet is a relatively small integrated circuit compared to the device substrate and includes a circuit including wires, connection pads, passive components such as resistors or capacitors, or active components such as transistors or diodes, formed on an independent substrate. Chiplets are manufactured separately from the display substrate and then applied to the display substrate. Details of these processes can be found, for example, in U.S. Pat. No. 6,879,098; U.S. Pat. No. 7,557,367; U.S. Pat. No. 7,622,367; US20070032089; US20090199960 and US20100123268.

The chiplets are preferably manufactured using silicon or silicon on insulator (SOI) wafers using known processes for fabricating semiconductor devices. Each chiplet is then separated prior to attachment to the device substrate. The crystalline base of each chiplet can therefore be considered a substrate separate from the device substrate and over which the chiplet circuitry is disposed. A plurality of chiplets therefore has a corresponding plurality of substrates separate from the device substrate and each other. In particular, the independent substrates are separate from the substrate on which the pixels are formed and the areas of the independent, chiplet substrates, taken together, are smaller than the device substrate.

Chiplets can have a crystalline substrate to provide higher performance active components than are found in, for example, thin-film amorphous or polycrystalline silicon devices. Chiplets can have a thickness preferably of 100 um or less, and more preferably 20 um or less. This facilitates formation of the adhesive and planarization material over the chiplet that can then be applied using conventional spin- or curtain-coating techniques. According to one embodiment of the present invention, chiplets formed on crystalline silicon substrates are arranged in a geometric array and adhered to a device substrate with adhesion or planarization materials. Connection pads on the surface of the chiplets are employed to connect each chiplet to signal wires, power busses and electrodes to drive pixels. Chiplets can control at least four pixels.

Since the chiplets are formed in a semiconductor substrate, the circuitry of the chiplet can be formed using modern lithography tools. With such tools, feature sizes of 0.5 microns or less are readily available. For example, modern semiconductor fabrication lines can achieve line widths of 90 nm or 45 nm and can be employed in making the chiplets of the present invention. The chiplet, however, also requires connection pads for making electrical connections to the wiring layer provided over the chiplets once assembled onto the display substrate. The connection pads are sized based on the feature size of the lithography tools used on the display substrate (for example 5 um) and the alignment of the chiplets to the wiring layer (for example +/−5 um). Therefore, the connection pads can be, for example, 15 um wide with 5 um spaces between the pads. This shows that the pads will generally be significantly larger than the transistor circuitry formed in the chiplet.

The pads can generally be formed in a metallization layer on the chiplet over the transistors. It is desirable to make the chiplet with as small a surface area as possible to enable a low manufacturing cost.

By employing chiplets with independent substrates (e.g. comprising crystalline silicon) having circuitry with higher performance than circuits formed directly on the substrate (e.g. amorphous or polycrystalline silicon), a device with higher performance is provided. Since crystalline silicon has not only higher performance but much smaller active elements (e.g. transistors), the circuitry size is much reduced. A useful chiplet can also be formed using micro-electro-mechanical (MEMS) structures, for example as described in "A novel use of MEMs switches in driving AMOLED", by Yoon, Lee, Yang, and Jang, Digest of Technical Papers of the Society for Information Display, 2008, 3.4, p. 13.

The device substrate can include glass and the wiring layers made of evaporated or sputtered metal or metal alloys, e.g. aluminum or silver, formed over a planarization layer (e.g. resin) patterned with photolithographic techniques known in the art. The chiplets can be formed using conventional techniques well established in the integrated circuit industry.

The present invention can be employed in devices having a multi-pixel infrastructure. In particular, the present invention can be practiced with LED devices, either organic or inorganic, and is particularly useful in information-display devices. In a preferred embodiment, the present invention is employed in a flat-panel OLED device composed of small-molecule or polymeric OLEDs as disclosed in, but not limited to U.S. Pat. No. 4,769,292 and U.S. Pat. No. 5,061,569. Inorganic devices, for example, employing quantum dots formed in a polycrystalline semiconductor matrix (for example, as taught in US 2007/0057263), and employing organic or inorganic charge-control layers, or hybrid organic/inorganic devices can be employed. Many combinations and variations of organic or inorganic light-emitting displays can be used to fabricate such a device, including active-matrix displays having top-emitter architecture or having bottom-emitter architecture.

The invention has been described in detail with particular reference to certain preferred embodiments thereof, but it should be understood that variations and modifications can be effected within the spirit and scope of the invention.

PARTS LIST 8 light signal
9 device side
10 display substrate
11 display area
12 first electrode
14 layers of light-emitting material
16 second electrode
18 insulating planarization layer
18A transparent insulating planarization layer
18B reflective layer
18C protective layer
18D reflective layer
19 light pipe
20 chiplet
22 chiplet circuit
24 connection pad
28 chiplet substrate
30 cover
32 conductor
40 light emitter
42 light detector
50 modulating circuit
62 demodulating circuit
60 controller
62 optical transceiver

The invention claimed is:

1. An electroluminescent display, comprising:
(a) a display substrate having a device side and a display area;
(b) a plurality of patterned first electrodes formed over the display substrate device side in the display area, one or more layers of light-emitting material formed over the plurality of first electrodes, and at least one second electrode formed over the one or more layers of light-emitting material, the first and second electrodes providing current to cause the light-emitting material to emit light in a light-emitting area within the display area;
(c) a plurality of chiplets distributed over the substrate, each chiplet having: a chiplet substrate separate and independent from the display substrate located over, and adhered to, the device substrate device side in the display area; one or more connection pads; and a chiplet circuit formed in the chiplet, the chiplet circuit electrically connected to one or more connection pads and at least one connection pad electrically connected to a first electrode;
(d) wherein each chiplet further includes a light detector and a light emitter, each separate from the one-or-more layers of light-emitting material connected to the chiplet circuitry and located on and in the surface of the chiplet, arranged so that light emitted by the light emitter of a first chiplet is received by the light detector of a second chiplet and the chiplet circuitry includes a modulating circuit for modulating light emitted by the light emitter and a demodulating circuit for demodulating light detected by the light detector; and
(e) further comprising at least one transparent layer covering a portion of the chiplets and wherein the light emitter of the first chiplet emits light into the transparent layer so that the light can propagate through the transparent layer to the second chiplet.

2. The electroluminescent display of claim 1, wherein the chiplet circuit includes circuitry for controlling current flow between the first and second electrodes.

3. The electroluminescent display of claim 1, wherein the display substrate is transparent and wherein light emitted by the light emitter in at least one chiplet is transmitted or reflected by the display substrate.

4. The electroluminescent display of claim 1, further comprising a cover that reflects or transmits light emitted by the light emitter in at least one chiplet.

5. The electroluminescent display of claim 1, further comprising an optical waveguide structure containing the transparent layer that extends from the first chiplet to the second chiplet and transmits light emitted by the light emitter of the first chiplet into the waveguide structure.

6. The electroluminescent display of claim 5, further comprising a controller external to the display substrate, the controller including a controller optical light emitter that emits light into the display substrate or waveguide structure.

7. The electroluminescent display of claim 1, wherein the modulated light is modulated according to image information.

8. The electroluminescent display of claim 1, wherein the modulating circuit temporally modulates the light emitted by the light emitter.

9. The electroluminescent display of claim 1, wherein the light emitter in each chiplet includes a bipolar junction transistor and each chiplet further includes a circuit adapted to selectively provide a non-destructive reverse breakdown voltage across an emitter-base junction of the corresponding bipolar junction transistor to cause the corresponding bipolar junction transistor to emit light.

10. A method of operating an electroluminescent display, comprising:
a) providing an electroluminescent display according to claim 1;
b) providing a display controller external to the electroluminescent display;
c) communicating information from the display controller to at least the first chiplet in the electroluminescent display;
d) optically communicating information from the first chiplet to the second chiplet in the electroluminescent display by modulating light emitted from the first chiplet light emitter and detecting and demodulating the modulated light using the second chiplet light detector; and
e) driving the first electrodes connected to each chiplet in accordance with the information to cause at least a portion of the light-emitting layer to emit light; and
f) providing at least one transparent layer covering a portion of the chiplets and wherein the light emitter of the first chiplet emits light into the transparent layer so that the light can propagate through the transparent layer to the second chiplet.

11. The method of claim 10, wherein the light emitted by the first chiplet light emitter is detected by all of the chiplet light detectors.

12. The method of claim 10, wherein the light emitted by the first chiplet light emitter is transmitted to only the light detector in the second chiplet.

13. The method of claim 10, wherein the light emitted by the first chiplet light emitter is transmitted through, or reflected from, the display substrate.

14. The method of claim 10, further including providing a controller external to the display substrate that emits modulated light into the display substrate to communicate information to one or more chiplets.

15. The method of claim 10, wherein the modulated light emitted by the first chiplet is broadcast and detected by multiple other chiplets.

16. The method of claim 10, wherein the modulated light emitted by the first chiplet is detected by only one of the other chiplets.

17. The method of claim 10, wherein the light modulation is temporal modulation.

* * * * *